United States Patent [19]
Aoshima et al.

[11] Patent Number: 5,198,921
[45] Date of Patent: Mar. 30, 1993

[54] LIGHT AMPLIFYING POLARIZER

[75] Inventors: Shinichiro Aoshima; Tsuneyuki Urakami; Yutaka Tsuchiya, all of Shizuoka, Japan

[73] Assignee: Hamamatsu Photonics K.K., Shizuoka, Japan

[21] Appl. No.: 795,397

[22] Filed: Nov. 21, 1991

[51] Int. Cl.$^5$ .............................................. H01L 27/14
[52] U.S. Cl. .................................... 359/248; 372/45; 359/344; 385/11
[58] Field of Search .................... 372/19, 703, 27, 45; 359/248, 251, 344; 385/11, 1, 2, 24, 15

[56] References Cited

U.S. PATENT DOCUMENTS

| | | | |
|---|---|---|---|
| 3,366,792 | 1/1968 | Ohm | 372/27 |
| 4,910,738 | 3/1990 | Fujita et al. | 372/27 |
| 4,923,291 | 5/1990 | Edagawa et al. | 372/27 |
| 4,941,738 | 7/1990 | Olsson | 372/703 |
| 4,952,017 | 8/1990 | Henry et al. | 385/15 |
| 5,012,474 | 4/1991 | White et al. | 372/27 |

FOREIGN PATENT DOCUMENTS

| | | |
|---|---|---|
| 0361035 | 4/1990 | European Pat. Off. |
| 55-039612 | 5/1980 | Japan |
| 60-187085 | 2/1986 | Japan |
| 1-257386 | 1/1989 | Japan |
| 1-055889 | 6/1989 | Japan |
| 2220522 | 1/1990 | United Kingdom |

OTHER PUBLICATIONS

"Fabrication and Performance of 1.5 μm GaInAsP Travelling-Wave Laser Amplifiers With Angled Facets", Electronics Letters, Sep. 10, 1987, vol. 23, No. 19, pp. 990–991.

"Subpicosecond Electrooptic Sampling: Principles and Applications", Janis A. Valdmanis, et al., IEEE Journal of Quantum Electronics, vol. QE-22, No. 1, Jan. 1986, pp. 69–78.

Way et al., "Applications of Traveling-Wave Laser Amplifiers in Subcarrier Multiplexed Lightwave Systems," IEEE Transactions on Microwave Theory and Techniques, vol. 38, No. 5, May 1990, pp. 534–545.

Besse et al., "Reflectivity Minimization of Semiconductor Laser Amplifiers with Coated and Angled Facets Considering Two-Dimensional Beam Profiles," IEEE Journal of Quantum Electronics, vol. 27, No. 6, Jun. 1991, pp. 1830–1836.

Saitoh et al., "Low Noise Characteristics of a GaAs-AlGaAs Multiple-Quantum-Well Semiconductor Laser Amplifier," IEEE Photonics Technology Letters, vol. 2, No. 11, Nov. 1990, pp. 794–796.

Primary Examiner—John D. Lee
Assistant Examiner—John Ngo
Attorney, Agent, or Firm—Finnegan, Henderson, Farabow, Garrett and Dunner

[57] ABSTRACT

A semiconductor light amplifier is driven by a drive device, and selectively amplifies one of a TM mode component and a TE mode component of input light. For example, TE mode light is selectively amplified by making thickness of the active layer of the semiconductor light amplifier not more than 0.05 μm, or by tilting at least one of the entrance and exit faces of the semiconductor light amplifier by 10 to 16 degrees. An another type of light amplifying polarizer, input signal light and excitation light are combined by a half mirror or an optical coupler, and combined light is input to a rare-earth-element doped, polarization maintaining optical fiber.

7 Claims, 7 Drawing Sheets

LIGHT AMPLIFYING POLARIZER

BACKGROUND OF THE INVENTION

The present invention relates to a polarizer capable of light amplification.

Conventional polarizers are typically in sheet form or made of calcite (e.g., Glan-Taylor prisms).

The conventional polarizers of these types extract part of the incident light to obtain desired linear polarization, so they inevitably involve the problem of a light loss.

In the case of handling an output of a photodetector which detects linearly polarized light provided from a conventional polarizer, if the noise is mainly a shot noise of the photodetector, the polarizer reduces the light intensity and will deteriorate the S/N ratio of the photodetector's output. Therefore, it is required to take special care in dealing with the light emerging from the polarizer.

SUMMARY OF THE INVENTION

The present invention has been accomplished under these circumstances, and has an object of providing a polarizer which permits light to be amplified (i.e., does not cause a light loss), and is capable of producing linearly polarized light that is easy to handle.

According to a first aspect of the invention, a polarizer comprises:

a semiconductor light amplifier for selectively amplifying one of a TM mode component and a TE mode component of input light; and means for driving the semiconductor light amplifier.

According to a second aspect of the invention, a polarizer comprises:

a polarization maintaining optical fiber doped with a rare earth element;

a light source for emitting excitation light for the polarization maintaining optical fiber.

means for combining input light and the excitation light to form combined light to be input to the polarization maintaining optical fiber.

DESCRIPTION OF THE PREFERRED EMBODIMENTS

Embodiments of the present invention will be described below with reference to the accompanying drawings.

Figure 1:
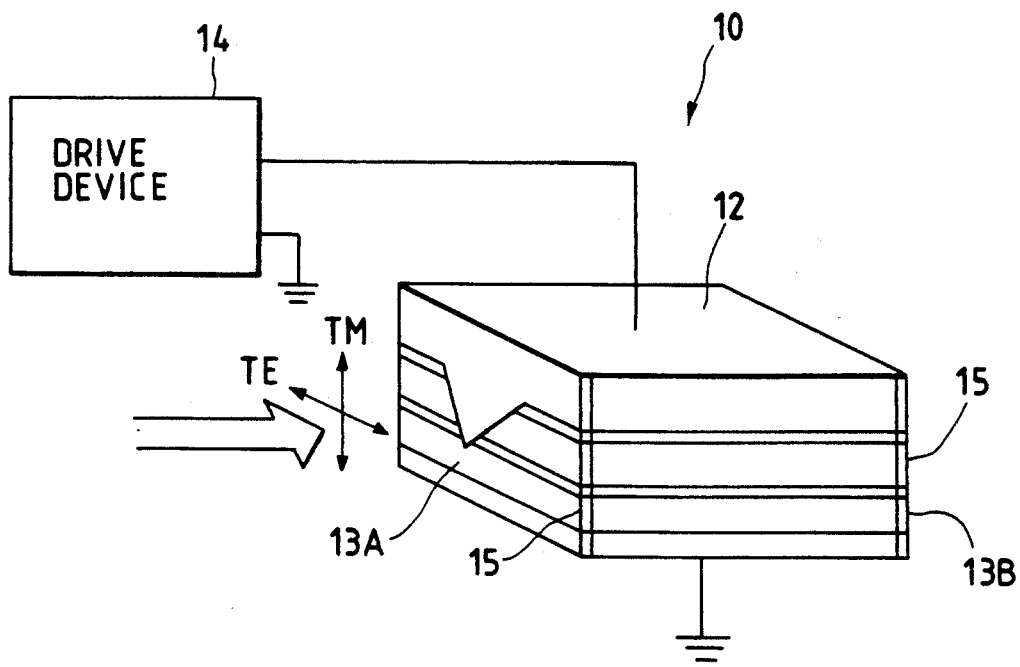
FIG. 1 is a diagram showing a polarizer according a first embodiment of the present invention.

A first embodiment of the present invention is shown in FIG. 1. A polarizer generally indicated by numeral 10 comprises a semiconductor light amplifier 12 and a drive device 14 for driving the semiconductor light amplifier 12. The semiconductor light amplifier 12 has a thinner active layer whose thickness is not more than 0.05 $\mu$m, desirably about 0.02 $\mu$m.

Figure 2:
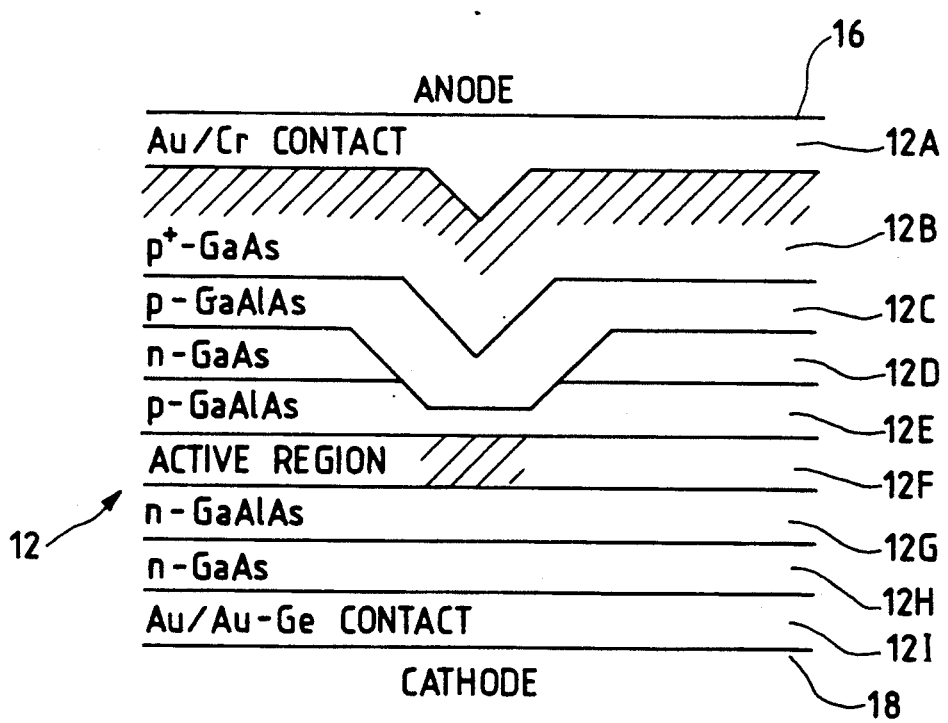
FIG. 2 is a sectional view showing a semiconductor light amplifier used in the first embodiment.

As exemplified in FIG. 2, the semiconductor light amplifier 12 has a SADH (self-aligned double heterojunction) structure, and comprises layers A-I (12A-12I) that are superposed one on another in the direction from an anode 16 towards a cathode 18. In the prior art, layer F, i.e., an active layer 12F, usually has a thickness of about 0.1 $\mu$m. But in the embodiment under consideration, that layer is adjusted to be not thicker than 0.05 $\mu$m, desirably about 0.02 $\mu$m.

Layer A (12A) serves as a Au/Cr contact. Layer B is a p$^+$-GaAs layer having Zn diffused in its hatched region. Layers C, E and G (12C, 12E and 12G) have a composition of Ga$_{1-x}$Al$_x$As where x=0.37. The active layer 12F has an effective active region (hatched in the figure) whose width and length are about 3 $\mu$m and 200 $\mu$m, respectively. Composition of the active layer 12F is Ga$_{1-x}$Al$_x$As where x=0.028.

If, as described above, the active layer 12F is adjusted to have a smaller thickness than in the usual case, the propagation of TM mode light through the active layer 12F is suppressed to lower the factor of light amplification. Thus, the amplification factor of TE mode light is relatively increased to insure that the light emerging from the semiconductor light amplifier 12 is not only linearly polarized but also amplified by a significant degree.

The difference in amplification factor between the TE and TM modes will be described below in detail.

Figure 3:
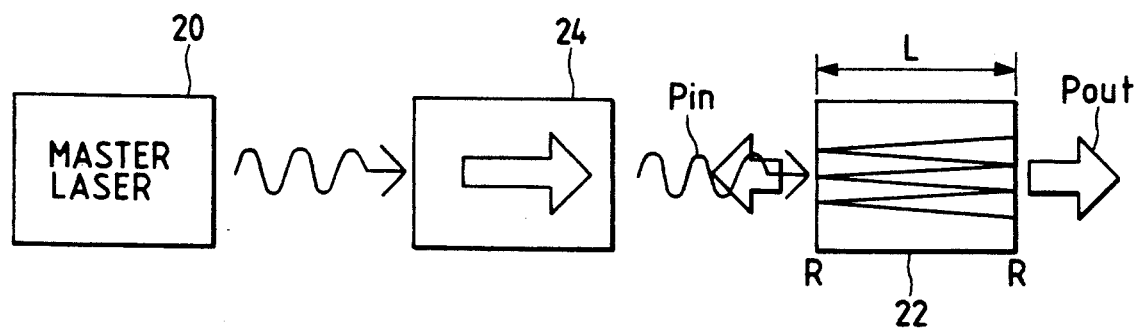
FIG. 3 is a block diagram showing the operation of the semiconductor light amplifier.

Suppose here that, as shown in FIG. 3, output light from a master laser 20 is input to a semiconductor light amplifier 22 having an end face reflectance R and a cavity length L. As a result of multiple reflections within a Fabry-Perot cavity having an optical gain, the amplification factor G (=Pout/Pin where Pin and Pout are an input signal power to and an output signal power from the semiconductor light amplifier 22, respectively) is given by:

$$G(\phi) = \{(1-R)^2 Gs\}/\{(1-RGs)^2 + 4GsR\sin^2(\phi/2)\} \quad (1)$$

where Gs and $\phi$ are a one-way gain and a go-and-return phase shift in the cavity, respectively. Reference numeral 24 in FIG. 3 represents an isolator.

The one-way gain Gs is expressed as:

$$Gs = \exp(\Gamma g - a_i)L \qquad (2)$$

where $\Gamma$ is a light confinement function, g is an optical gain of the active layer, and $a_i$ is an absorption coefficient.

Parameter Gs provides an amplification factor for the case of a traveling wave amplifier where the reflectance at both end faces of the cavity is neglected.

With the thinner active layer 12F, the degree of optical confinement of TM mode light, $\Gamma_{TM}$, can be reduced and, hence, Gs of TM mode light, can be reduced. As a result, the amplification factor G of TM mode light is reduced, and a relationship $G_E/G_m > 10$ is established where $G_E$ and $G_M$ are amplification factors of TM mode light and TE mode light, respectively.

Preferably, a light entrance face 13A and a light exit face 13B of the semiconductor light amplifier 12 are coated with an anti-reflection film 15.

A second embodiment will be described below with reference to FIGS. 4 through 7A-7C.

Figure 4:
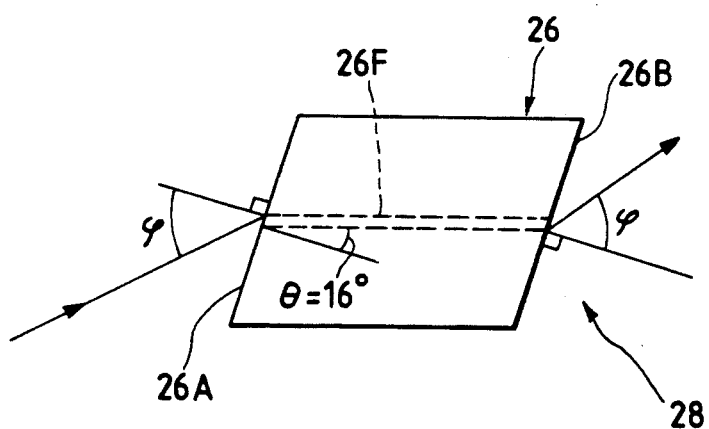
FIG. 4 is a plan view showing a semiconductor light amplifier of a polarizer according to a second embodiment of the invention.

As shown in FIG. 4, which is a top view (see FIG. 1), a polarizer generally indicated by numeral 28 comprises a semiconductor light amplifier 26 whose light entrance and exit faces 26A, 26B are made cutting faces tilted by an angle $\theta$ where $10° \leq \theta \leq 16°$. Shown by reference symbol 26F in FIG. 4 is an active layer.

By tilting the light entrance and exit faces 26A, 26B, only TE mode light is efficiently amplified and selected.

The reason for this favorable phenomenon is explained as follows. First, the go-and-return phase shift $\phi$ in equation (1) is given by:

$$\begin{aligned}\phi &= 4\pi(\nu_{in} - \nu_0)Ln_g/c \qquad (3)\\ &= 4\pi Ln_g(1/\lambda_{in} - 1/\lambda_0)\end{aligned}$$

where $\nu_{in}$ is a frequency of input signal light (its wavelength is $\lambda_{in}$), $\nu_o$ is a resonance frequency (resonance wavelength is $\lambda_o$), $n_g$ is an effective refractive index in the cavity mode, and c is the velocity of light.

For the sake of simplification, let assume that $\nu_{in} = \nu_o$. Then, $\phi$ becomes equal to zero and equation (1) is rewritten as:

$$\begin{aligned}G &= P_{out}/P_{in} \qquad (1')\\ &= (1 - R)^2 Gs/(1 - RGs)^2.\end{aligned}$$

With the semiconductor light amplifier 12 shown in FIG. 1, a value of 200 has been obtained for G when R=1%. Substituting these values into equation (1') and considering the condition G>Gs, one can see that Gs is 50.

Figure 5:
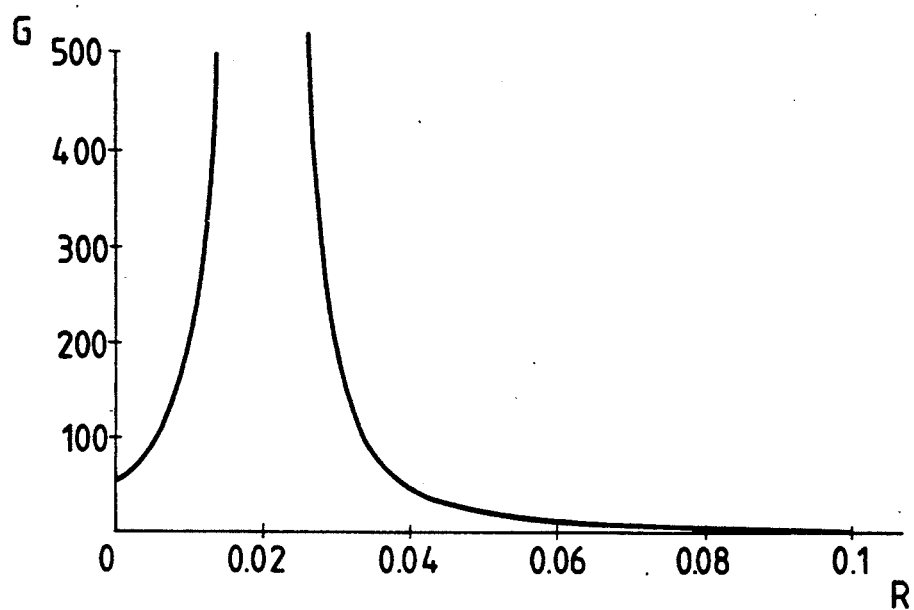
FIG. 5 is a graph showing a relationship between an amplification factor of a semiconductor light amplifier and a reflectance at its entrance and exit faces.
Figure 6:
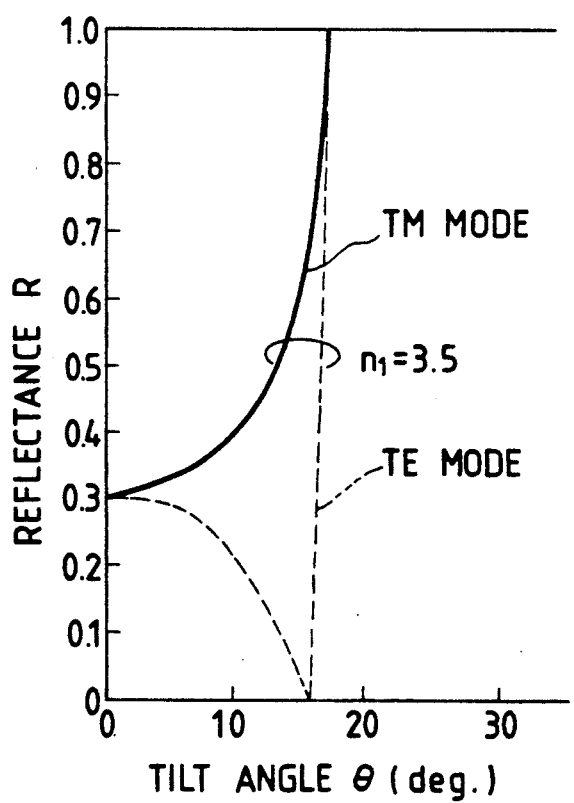
FIG. 6 is a graph showing a relationship between the reflectance at the entrance and exit faces and their cutting angle with an assumption that an active layer of the semiconductor light amplifier has a refractive index of 3.5.

If Gs=50 is substituted into equation (1'), the relationship between R and G is obtained as shown in FIG. 5. Since the saturation of the gain g is not considered in FIG. 5, the values of G appears greater than they would actually be. But it can still be seen that a satisfactory reflectance is achieved in the range of R of 0.01-0.03.

On the other hand, the reflectance for light that has reached the end face of the semiconductor light amplifier 26 ($n_1 = 3.5$) after passage through its active layer 26F is dependent on the angle $\theta$ of the entrance and exit faces 26A and 26B, and there exists a value of $\theta$ at which the reflectance differs greatly between TM mode light and TE mode light. As is clear from FIG. 6, if $\theta$ is selected to be 15°, a reflectance for TE mode light is about 0.02 whereas that for TM mode light is 0.6.

Thus, according to FIG. 5, the amplification factor G of TM mode light is negligibly smaller than that of TE mode light and, therefore, only TE mode light can be amplified in an efficient manner.

Equations (1) and (1') stand only where the light reflected by the end faces returns to the active layer. But if the entrance and exit faces of the semiconductor light amplifier are titled, the proportion that the reflected light from the end face is recoupled to the active layer will become smaller than where the end faces are not titled, resulting in some deviations from the equations. If the angle $\theta$ is selected to be 16° in consideration of the reflection characteristics shown in FIG. 6, there will be no loss of TE mode light, which will therefore emerge from the amplifier with no attenuation. On the other hand, about 70% of TM mode light is reflected and some part thereof leaks out from the active layer 26F to cause a loss. As a consequence, only TE mode light will emerge after effective selection.

When $\theta$ is 16°, Snell's law gives an incident angle $\psi = 75°$ ($1 \cdot \sin\psi = 3.5 \cdot \sin 16°$). This indicates that light needs to be incident on the entrance face 26A of the semiconductor light amplifier 26 at an incident angle $\psi$ of 75°. In the above equation of Snell's law, 3.5 represents a refractive index of the active layer 26F.

In the embodiment under consideration, an anti-reflection film may be provided on the entrance and exit faces 26A, 26B. In this case, the cutting angle $\theta$ is determined at a value that matches the refractive index of the anti-reflection film so that only TE mode light will selectively be amplified.

Figure 7A:
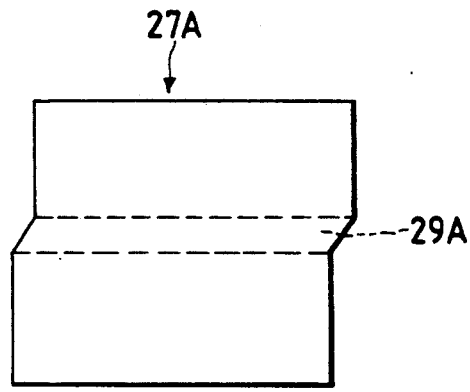
FIGS. 7A-7C are plan views showing modifications of the second embodiment shown FIG. 4.
Figure 7B:
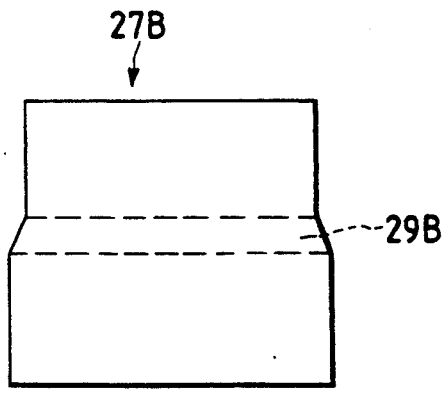
Figure 7C:
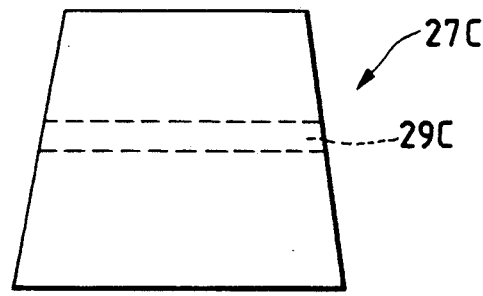

In the second embodiment discussed above, the semiconductor light amplifier 26 has a parallelepiped shape as seen from the top. However, this is not the sole case for the geometry of the amplifier, but it may be configured like a semiconductor light amplifier 27A shown in FIG. 7A, in which, as shown from the top, halves of a rectangle are connected together by a parallelepiped active layer 29A. Alternatively, the amplifier may be configured like a semiconductor light amplifier 27B shown in FIG. 7B, in which two rectangles of different sizes are connected together by a trapezoidal active layer 29B. As a further alternative, it may be configured like a semiconductor light amplifier 27C shown in FIG. 7C, which is generally trapezoidal as seen from the top. Shown by reference symbol 29C in FIG. 7C is an active layer.

A third embodiment of the present invention will be described below with reference to FIG. 8.

Figure 8:
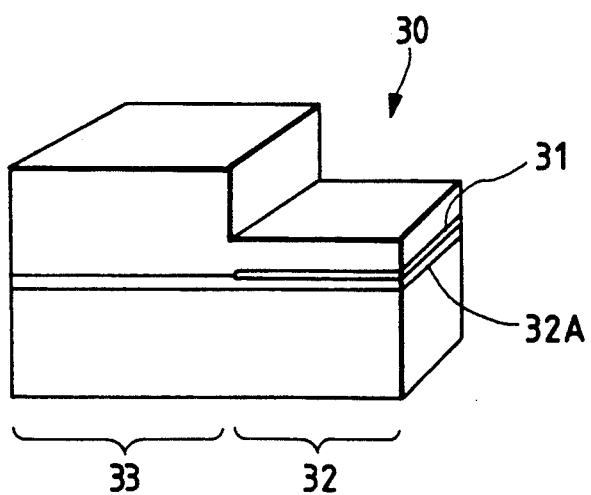
FIG. 8 is a perspective view showing a semiconductor light amplifier of a polarizer according to a third embodiment of the invention.

A semiconductor light amplifier generally indicated by numeral 30 in FIG. 8 has a light waveguide portion 32 which is provided with a metal film 31. Shown by numeral 33 in FIG. 8 is a light amplifying portion of the semiconductor light amplifier 30. The metal film 31 is provided adjacent to the top of an active layer 32A of the light waveguide portion 32.

When light is incident on the semiconductor light amplifier 30, TM mode light, which has an electric field component normal to the metal film 31, is attenuated, so that only TE mode light is selectively amplified. Thus, almost all of the light emerging from the semiconductor light amplifier 30 is the amplified TE mode light and, as a result, desired linearly polarized light can be obtained with amplification.

As in the previous embodiments, an anti-reflection film may be coated on both the light entrance and exit faces of the semiconductor light amplifier 30.

Figure 9:
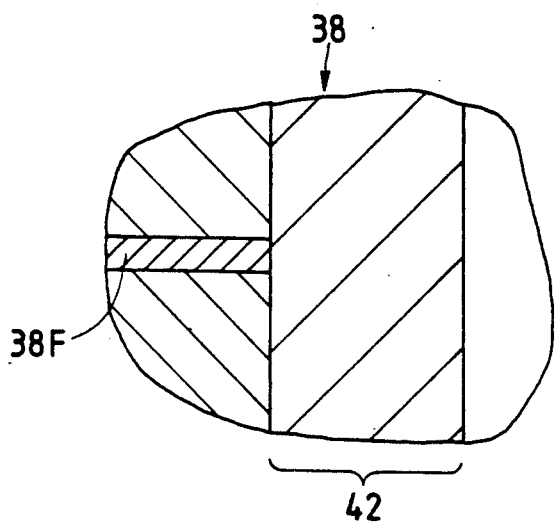
FIG. 9 is a sectional view showing an enlarged essential part of a semiconductor light amplifier of a polarizer according to a fourth embodiment of the invention.

A fourth embodiment of the invention will be described below with reference to FIG. 9.

In this embodiment, a transparent window structure 42 is formed on the end face of an active layer 38F of a semiconductor light amplifier 38 (shown only partially).

In the fourth embodiment, the difference in beam divergence between TM mode light and TE mode light that travel through the window region in the free space mode is effectively used to insure that the TM mode light returning to the active region will be coupled with a different efficiency than the TE mode light.

Figure 10A:
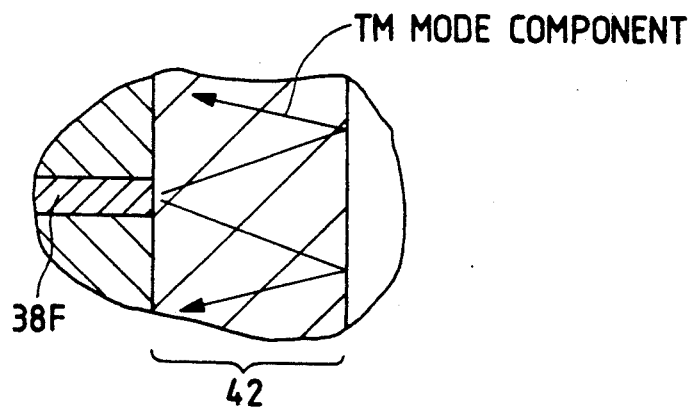
FIGS. 10A and 10B are sectional views showing how light spreads and is reflected in the essential part shown in FIG. 9.
Figure 10B:
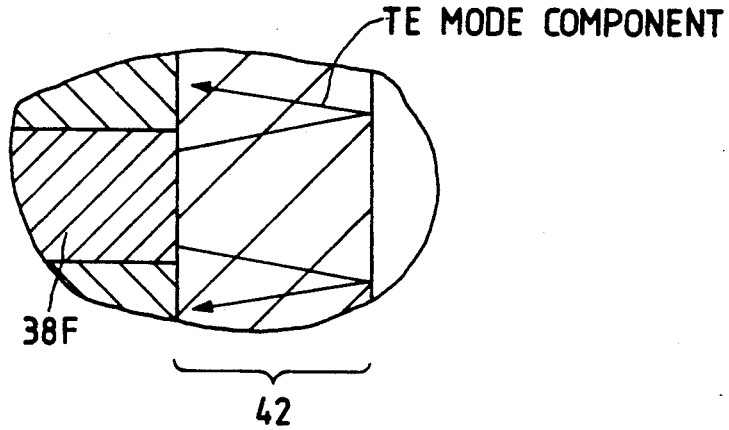

Stated more specifically, the TM mode light spreads at a wider angle to enter the window region as shown in FIG. 10A (vertical sectional view), so that a smaller amount of light will be reflected by the cleaved surface 40 to return to the active layer 38F, whereby the coupling efficiency is low. On the other hand, as shown in FIG. 10B (horizontal sectional view), the TE mode light spreads at a narrower angle to enter the window region, so that, compared to the TM mode light, more of the light will return to the active layer 38F, resulting in a relatively high coupling efficiency.

If the effective reflectance R is 0.02 and 0.005 for the TE and TM modes, respectively, one can readily see from FIG. 5 that only TE mode light will be amplified with high efficiency.

Although the first to fourth embodiments are described as amplifying TE mode light, it should be noted that structures of the embodiments may be modified to provide amplification of TM mode light, specifically in the case of the fourth embodiment.

A fifth embodiment of the invention will be described below with reference to FIG. 11.

In this embodiment, a polarizer generally indicated by numeral 47 is constructed such that a polarization maintaining optical fiber 46 doped with a rare earth element, which serves as a fiber amplifier, is used to pickup desired linearly polarized light with amplification. Exemplary rare earth elements that can be used as a dopant include Nd, Er, Ho, Sm and Tm, and their ions.

Figure 11:
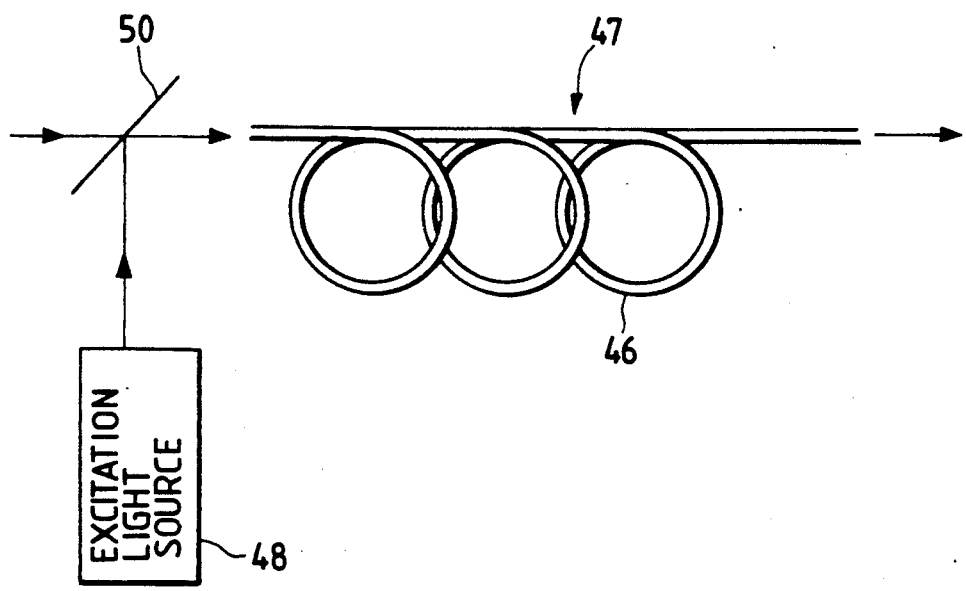
FIG. 11 is a diagram showing a polarizer according to a fifth embodiment of the invention.

Shown by numeral 48 in FIG. 11 is an excitation light source. Excitation light emitted from the light source 48 is combined with the input light by a half mirror 50, and the combined light is input to the rare-earth-element doped, polarization maintaining optical fiber 47 from its entrance face.

Figure 12:
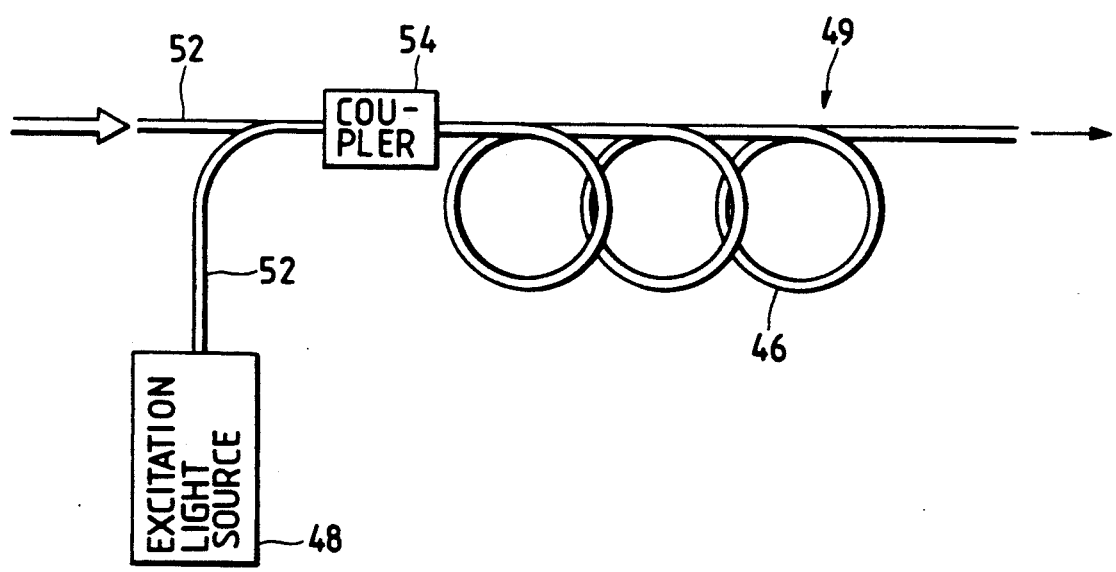
FIG. 12 is a diagram showing a modification of the fifth embodiment.

In the fifth embodiment of FIG. 11, the half mirror 50 is used to combine the input light and the excitation light. A modification is shown in FIG. 12, in which a polarizer 49 is constructed such that both the input light and the excitation light are guided by respective optical fibers 52 and combined by an optical coupler 54, with the combined light being then input to a rare-earth-element doped, polarization maintaining optical fiber 46.

The output light from the rare-earth-element doped, polarization maintaining optical fiber 46 usually contains an excitation light component as noise. If a large amount of the excitation light component is likely to be contained, a filter, dichroic mirror, prism or some other element may be provided after the exit face of the optical fiber 46.

In the case of using the rare-earth-element doped, polarization maintaining optical fiber 46, an anti-reflection film may be coated on both the entrance and exit faces, or those faces may be made cutting faces having an appropriate tilt angle such as a Brewster angle, or may be provided with a window structure. In these modifications, the purity of the output linearly polarized light can further be increased.

The latter two cases will be described in more detail. If the sectional shape of the core of the rare-earth-element doped, polarization maintaining optical fiber 46 is elliptical or rectangular, the end face is tilted such that the major axis or longitudinal axis of the core coincides with the major axis of a resulting tilted end face. If the tilt angle is equal to a Brewster angle, a light component having a polarization direction along the major axis of the core is solely input and output with a small loss. As a result, there can be caused a difference in the amplification factors of such a light component and a light component having a polarization direction perpendicular thereto. The provision of the window structure on the end faces will causes the same effects as shown in FIGS. 9, 10A and 10B.

Figure 13A:
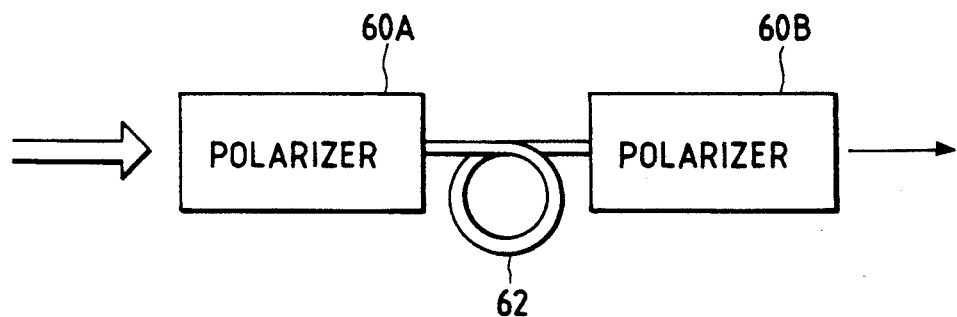
FIGS. 13A and 13B are diagrams showing two examples in which the polarizers of the invention are combined together.
Figure 13B:
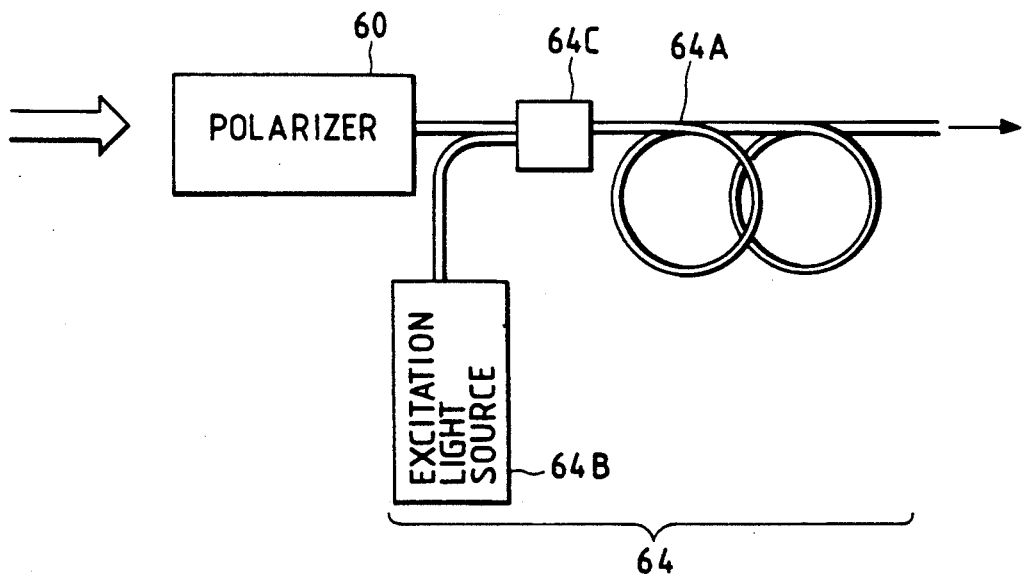

In the embodiments described above, only one unit of polarizer is used. It should, however, be noted that the present invention is in no way limited to those embodiments, but various modifications may be made to obtain output light that has been linearly polarized to an even greater extent. For example, two polarizers 60A and 60B comprising a semiconductor light amplifier are cascade-connected via an optical fiber 62 as shown in FIG. 13A. Alternatively, a polarizer 60 comprising a semiconductor light amplifier is combined with a polarizer 64 comprising a rare-earth-element doped, polarization maintaining optical fiber 64A as shown in FIG. 13B. Shown by symbols 64B and 64C in FIG. 13B are an excitation light source and an optical coupler, respectively. In the case of using a polarization maintaining optical fiber, more purely polarized light can be obtained simply by changing its length rather than by connecting a plurality of units in series.

Figure 14:
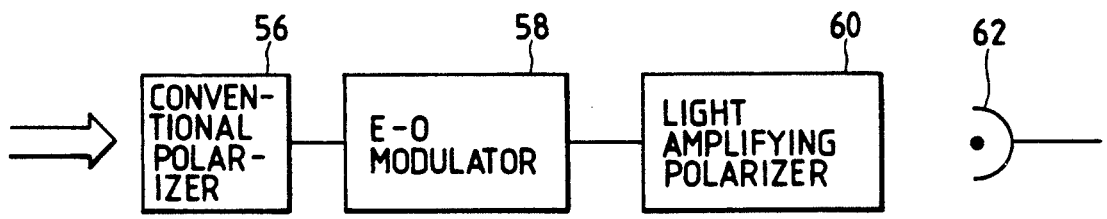
FIG. 14 is a block diagram showing an application example in which the polarizer of the invention is incorporated in an E-O voltage detector.

A practical application of the polarizer of the invention is shown in FIG. 14, in which it is incorporated in an electrooptic (E-0) voltage detector that uses an E-0 device. The system shown in FIG. 14 comprises a conventional polarizer 56; an E-0 modulator 58 to which probing light transmitted through the polarizer 56 is supplied, and which is modulated by an electric signal to be measured; a light amplifying polarizer 60 of the invention which amplifies an output light of the E-0 modulator 58; and a photodetector 62 that converts an output light of the light amplifying polarizer 60 to an electric signal.

In the case of a conventional system corresponding to the above one, polarizers would suffer from a large light loss. But in the system of FIG. 14, the output light of the E-0 modulator 58 is sufficiently amplified by the light amplifying polarizer 60, which improves the S/N ratio of the output signal from the photodetector 62, and facilitates the handling of the light at the stages after the light amplifying polarizer 60.

What is claimed:
1. A polarizer comprising:
  a semiconductor light amplifier for selectively amplifying one of a TM mode component and a TE mode component of input light so that a ratio between amplification factors of the TM mode and TE mode components becomes larger than 10; and means for driving the semiconductor light amplifier.

2. The polarizer of claim 1, wherein an active layer of the semiconductor light amplifier has a thickness of not more than 0.05 μm.

3. The polarizer of claim 1, wherein at least one of entrance and exit faces of the semiconductor light amplifier is tilted by 10 to 16 degrees.

4. The polarizer of claim 1, wherein the semiconductor light amplifier comprises a light waveguide portion which includes an active layer and a metal film provided adjacent the active layer.

5. The polarizer of claim 1, wherein entrance and exit faces of the semiconductor light amplifier are provided with an anti-reflection film.

6. The polarizer of claim 1, wherein the semiconductor light amplifier comprises a transparent window structure on at least one entrance and exit faces thereof.

7. The polarizer of claim 1, wherein a plurality of polarizers are connected in series.

* * * * *